(12) United States Patent
Imam et al.

(10) Patent No.: US 6,492,679 B1
(45) Date of Patent: Dec. 10, 2002

(54) METHOD FOR MANUFACTURING A HIGH VOLTAGE MOSFET DEVICE WITH REDUCED ON-RESISTANCE

(75) Inventors: Mohamed Imam, Tempe, AZ (US); Joe Fulton, Chandler, AZ (US); Zia Hossain, Tempe, AZ (US); Masami Tanaka, Fukushima (JP); Taku Yamamoto, Ishidou-machi (JP); Yoshio Enosawa, Miyagi-ken (JP); Katsuya Yamazaki, Monden-machi (JP); Evgueniy N. Stefanov, Vieille Toulouse (FR)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/920,655

(22) Filed: Aug. 3, 2001

(51) Int. Cl.[7] ............................................. H01L 29/76
(52) U.S. Cl. ...................................... 257/342; 257/550
(58) Field of Search ............................. 257/342, 550; 438/392, 243

(56) References Cited

U.S. PATENT DOCUMENTS 6,365,457 B1 * 4/2002 Choi ........................... 438/258
6,365,941 B1 * 4/2002 Rhee ........................... 257/357
6,369,424 B1 * 4/2002 Nakamura et al. ........... 257/339
2002/0017684 A1 * 2/2002 Blanchard et al. ........... 257/342
2002/0024056 A1 * 2/2002 Miyakoshi et al. .......... 257/144

* cited by examiner

Primary Examiner—Okik Chaudhuri
Assistant Examiner—William C Vesperman (57) ABSTRACT

A high voltage MOSFET device (100) has a well region (113) with two areas. The first area (110) has a high dopant concentration and the second area (112) has a low dopant concentration. Inside the well region a region of a secondary conductivity type (108) is formed. The second area (110) is typically underlying a gate region (105). The lower doping concentration in that area helps to increase the breakdown voltage when the semiconductor device is blocking voltage and helps to decrease the on-resistance when the semiconductor device is in the "on" state. The MOSFET device further has a p-top layer (108) which is disposed on the top surface of the well region and then driven into the well region by annealing the MOSFET device at a high temperature in an inert atmosphere.

4 Claims, 7 Drawing Sheets

METHOD FOR MANUFACTURING A HIGH VOLTAGE MOSFET DEVICE WITH REDUCED ON-RESISTANCE

BACKGROUND OF THE INVENTION

The present invention relates in general to high voltage MOSFET semiconductor devices and more specifically to a method for manufacturing a high voltage MOSFET semiconductor device with reduced on-resistance.

When designing high voltage metal oxide semiconductor (MOS) devices two criteria must be kept in mind. First, the semiconductor device should have a high breakdown voltage ($V_{BD}$). Second, the semiconductor device, when operating, should have a low on-resistance ($RDS_{ON}$). One problem is that techniques and structures that tend to maximize breakdown voltage tend to adversely affect on-resistance and vice versa.

Different designs have been proposed to create semiconductor devices with acceptable combinations of breakdown voltage and on-resistance. One such family of semiconductor devices is fabricated according to the reduced surface field (RESURF) principle. Semiconductor devices with RESURF typically utilize an extended drain region, such as an nwell, to support high off-state voltage, i.e. an increase in breakdown voltage, $V_{BD}$. Such RESURF semiconductor devices can have a charge in the drain area of about $1 \times 10^{12}$ atoms/cm$^2$ before avalanche breakdown occurs. The high charge sets up a low onresistance since on-resistance is inversely proportional to the charge in the extended drain region.

In order to reduce the on-resistance, some RESURF devices incorporate a top layer of a conductivity type opposite the extended drain region, such as a p-top layer, inside the extended drain region. The addition of the p-top layer into the extended drain region permits the charge in the extended drain to increase as compared to designs without a p-top layer, which in turn decreases the on-resistance significantly. Furthermore, when the extended drain region is supporting high voltage, the p-top layer aids in the depletion of the more heavily doped extended drain region, thus allowing for high breakdown voltage.

One drawback to this approach is that a high charge under the gate region and adjacent to the channel region can lead to premature breakdown when the device is blocking voltage.

BRIEF DESCRIPTION OF THE DRAWINGS

For a more complete understanding of the present invention and advantages thereof, reference is now made to the following description, taken in conjunction with the following drawings.

DETAILED DESCRIPTION OF THE DRAWINGS

The present invention relates to high voltage MOSFET semiconductor devices that have a high breakdown voltage and low on-resistance. While the following discussion describes an n-channel device, it should also be understood that the same applies to p-channel devices, with the conductivity of the described regions and layers reversed.

Figure 1:
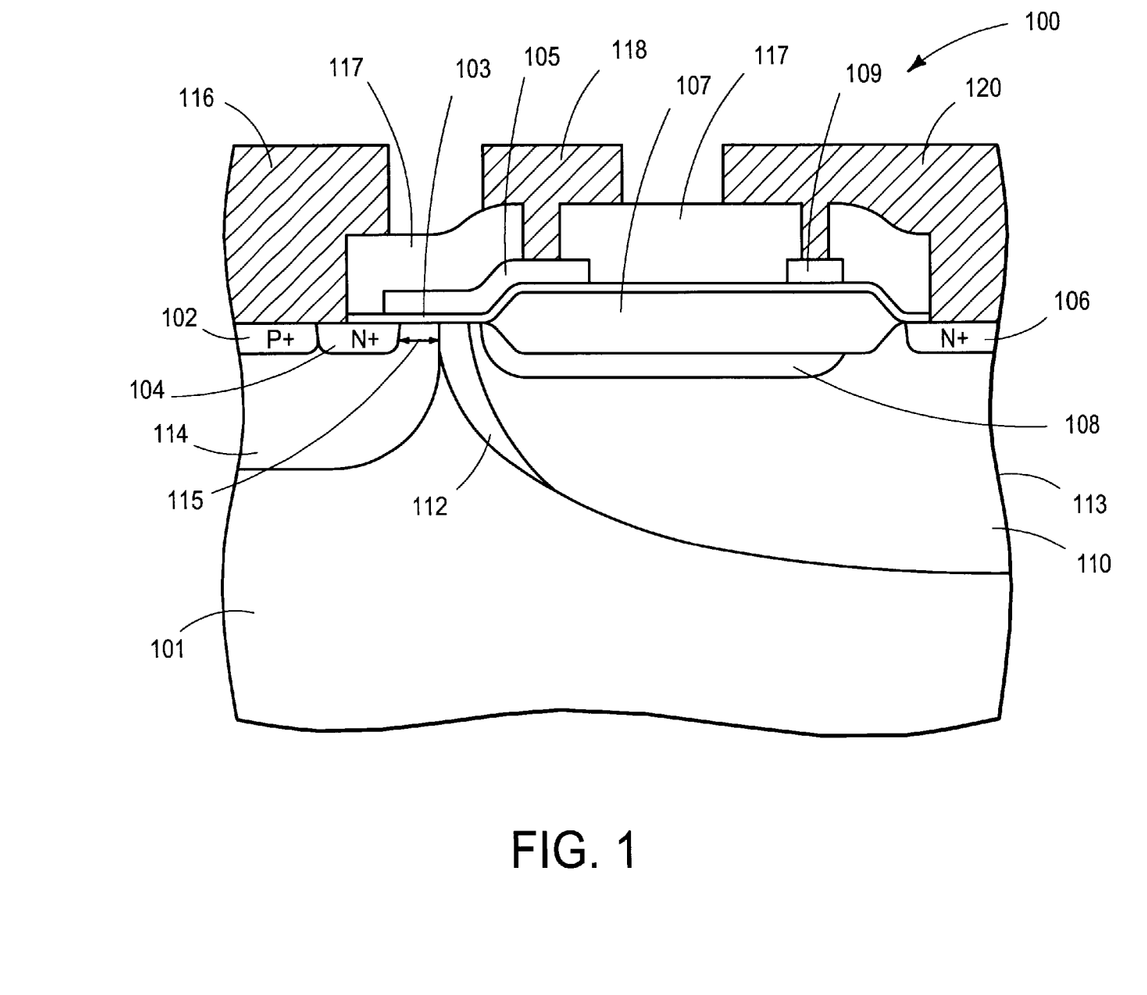
FIG. 1 is a cross-sectional side view of a semiconductor device showing an enhanced nwell.

FIG. 1 is a cross-sectional view of an exemplary n-channel MOSFET semiconductor device 100. Illustrated is a lightly doped p-type substrate region 101. A N+ source diffusion region 104 is formed at the top surface of substrate region 101. A P+ diffusion region 102 is formed laterally adjacent to N+ source diffusion region 104. The P+ diffusion region 102 increases the integrity of the source to substrate connection and reduces the semiconductor device's susceptibility to parasitic bipolar effects. Associated with N+ source diffusion region 104 and P+ diffusion region 102 is a source electrode 116, which provides electrical contact to N+ source diffusion region 104 and P+ diffusion region 102.

A thin insulating layer 103, comprising silicon dioxide or other insulating dielectric material, is formed at the top surface of substrate 101. Over the insulating layer 103 is a gate region 105, typically formed from a conductive material such as polysilicon. A gate electrode 118 is coupled to gate region 105 to provide an electrical contact. An interlayer dielectric (ILD) 117 overlies insulating layer 103 and gate region 105.

A N+ drain diffusion region 106 is formed at the top surface of substrate 101 spaced laterally away from source diffusion region 104 and electrically connected to drain electrode 120. A drain flap 109 of conductive material such as polysilicon is formed on the top of insulating layer 103 and made in electrical contact with drain electrode 120. The conductive material redistributes the electric field in the proximate area, commonly known as the field plate effect. Source, gate, and drain electrodes 116, 118, 120 may comprise of a number of conductive metals or metal alloys.

An optional diffused P region 114 may be formed in substrate 101 to enclose P+ diffusion region 102 and N+ source diffusion region 104. The diffused P region 114 is a high voltage P-region (PHV) which reduces the semiconductor device's susceptibility to drain-to-source punch through and further provides an appropriate threshold voltage. A channel region 115 is laterally formed from source diffusion region 104 to the end of diffused p region 114.

An nwell region 113, comprising a first region of high doping concentration 110 and a second region of lower doping concentration 112, is formed in substrate 101 extending from channel region 115 to N+ drain diffusion region 106. Nwell region 113 is formed by performing a first nwell implant with a fairly light doping, with a total charge on the order of $1.0 \times 10^{12}$ atoms/cm$^2$, and then forming a second nwell implant inside first nwell implant, but laterally offset towards the drain by a fixed amount, for example 10 microns. The second nwell implant has a much higher concentration of dopants, which contributes to a total charge on the order of $2 \times 10^{12}$ atoms/cm$^2$. Alternatively, the higher concentration implant can be performed first and the lower concentration implant can be performed second.

The combination of the two implants produces the first region 110, where the concentration of dopants and, therefore, the charge, is very high. In the second region 112, the concentration of dopants is based on the doping of first nwell implant and the out-diffusion of the second nwell implant. The second region 112 will have a lower concentration of dopants and, hence, a lower charge. In some embodiments, nwell region 113 can also be extended under PHV region 114. While nwell region 113 is shown as an implant, the region may also be an n-epi layer formed by epitaxial growth.

A p-top layer 108 is formed within nwell region 113 for charge balancing. The p-top layer 108 is disposed on the top surface of nwell region 113 and then driven into nwell region 113 by annealing semiconductor device 100 at a high temperature of 1050° C. in an inert atmosphere. A dielectric layer 107 made of field oxide overlies p-top layer 108. The growth of field oxide 107 consumes some portion of the underlying p-top layer 108. It is important that a sufficient and controllable thickness of p-top layer 108 remain after growth of field oxide 107. Consequently, p-top layer 108 is driven into nwell region 113 deep enough to insure that the top surface of p-top layer 108 is consumed in a controllable manner during the growth of field oxide 107. After field oxide 107 is formed, the top surface of p-top layer 108 is typically about 0.5 microns below the silicon surface and p-top layer 108 extends approximately 2.0 to 2.5 microns into nwell region 113, as shown in FIG. 1.

Figure 2:
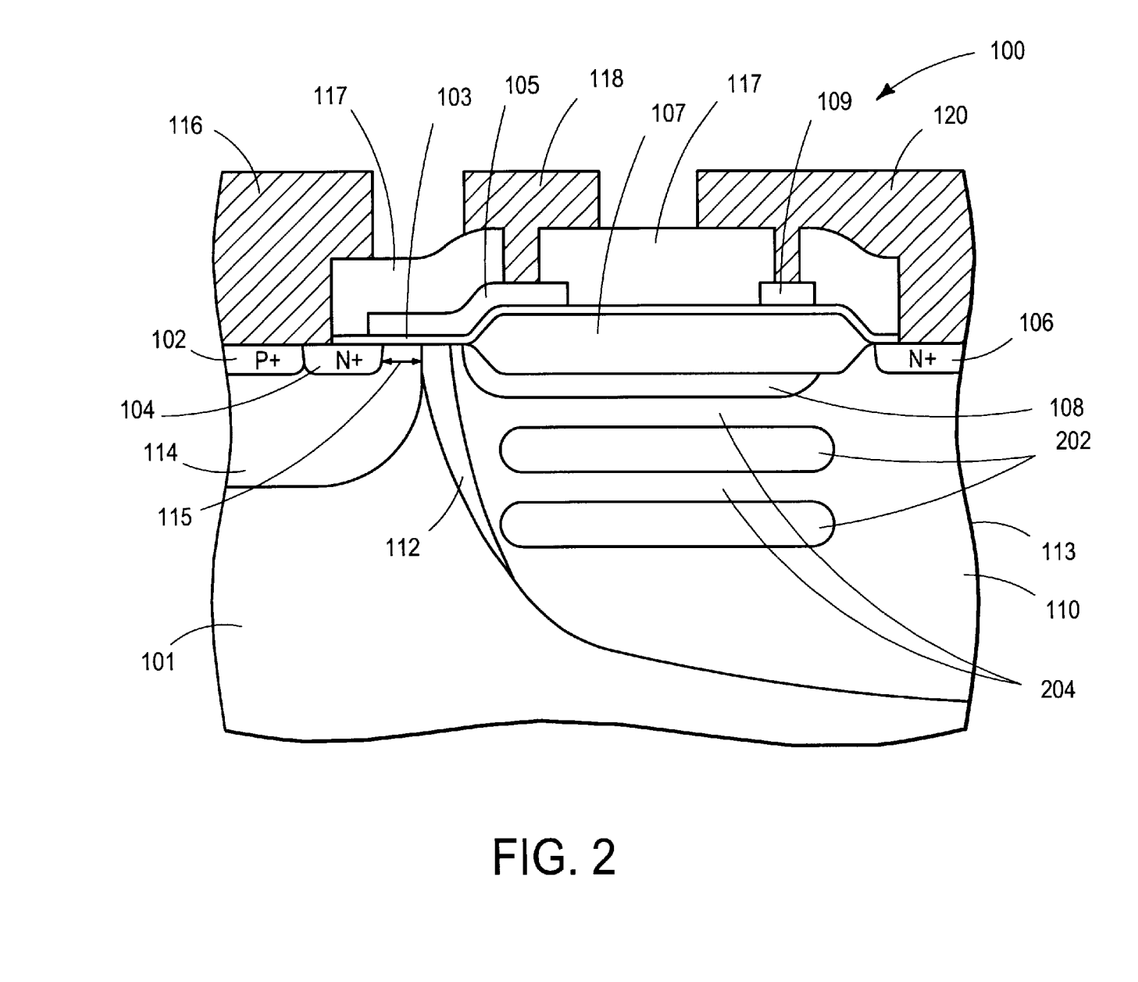
FIG. 2 is a cross-sectional side view of the semiconductor device including multiple p-regions.

More than one p-layer may be formed within nwell 113, see FIG. 2. The p-top layer 108 allows for downward depletion into the extended drain region when semiconductor device 100 is under voltage blocking mode. This feature, along with the upward depletion from substrate 101 below nwell 113, allows for a high breakdown voltage. The double-depletion effect also allows for increased doping in nwell 113 to achieve a lower on-resistance.

The second region 112 of nwell region 113 provides a lighter doping concentration under gate region 105. The advantages of having a lighter doping concentration in region 112 include (1) an increase in the depletion extension into nwell region 113, which prevents premature breakdown by distributing the critical points of the electric field at the surface of the semiconductor device, (2) an increase in the breakdown voltage when the semiconductor device is blocking voltage ("off state"), and (3) a reduction in the on-resistance when the semiconductor device is in the "on" state and the surface near gate 105 becomes accumulated.

FIG. 2 is a cross-sectional side view of semiconductor device 100, including multiple p-regions 202. All other reference numbers and features in FIG. 2 correspond to FIG. 1. Illustrated is semiconductor device 100 with a nwell region 113 comprised of a first region 110 of high concentration laterally offset from the second region 112 of low concentration. Also, illustrated below p-top layer 108 are a plurality of p-regions 202 separated by conductivity channels 204. These p-regions 202 are formed, for example, by high-energy ion implantation. The conductivity channels 204 can each carry a large charge, which allows for a low on-resistance.

Figure 3A:
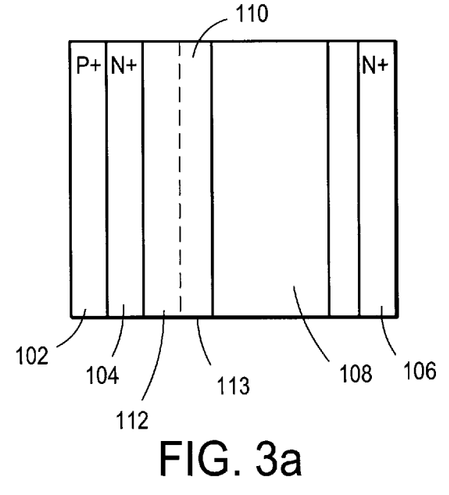
FIGS. 3a, 3b and 3c are simplified cross-sectional top views of the semiconductor device with different arrangements of the p-top layers.
Figure 3B:
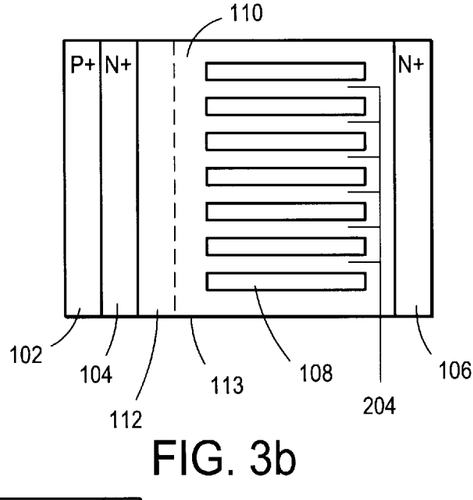
Figure 3C:
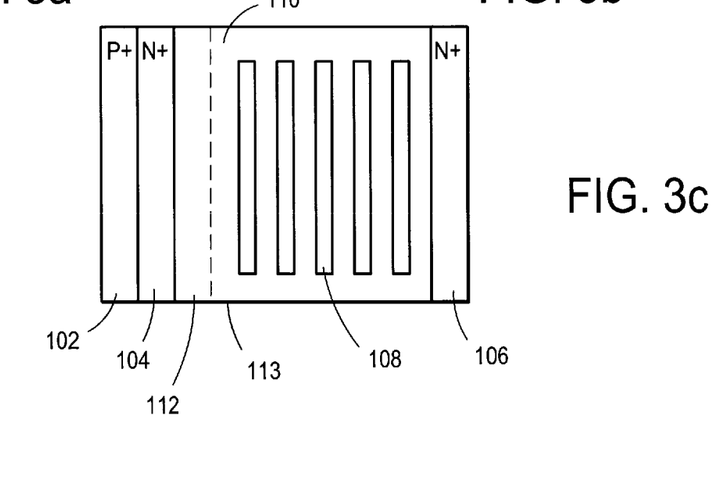

FIGS. 3a, 3b and 3c are simplified cross-sectional top views of semiconductor device 100. The top views in FIGS. 3a, 3b and 3c omit layers that are understood for purposes of clarity. Illustrated in FIG. 3a is N+ source diffusion region 104, the adjacent P+ diffusion region 102, the N+ drain diffusion region 106 and p-top layer 108 which is shown as one solid p-top layer. The P-top layer 108 overlies nwell 113, which comprises of the first region 110 of high dopant concentration and the second region 112 of low dopant concentration. P-top layer 108 is formed in nwell 113. As discussed in conjunction with FIG. 2, there can be multiple p-regions under p-top layer 108.

FIG. 3b illustrates semiconductor device 100 with p-top layer 108 as multiple "stripes" of p-top material each one separated by a conductive nwell channel region 204 which is parallel to current flow (current will flow from the source to the drain). FIG. 3b also illustrates nwell 113 having a first region 110 of high dopant concentration and a second region 112 of lower dopant concentration.

FIG. 3c is similar to FIG. 3b except the "stripes" of p-top layer 108 are aligned perpendicular to current flow. Again, nwell 113 is illustrated having a first region 110 of high dopant concentration and a second region 112 of low dopant concentration. While FIG. 3b and 3c show p-top as "striped" regions, other shapes and patterns of p-top can also be adopted. Examples include a plurality of squares, checkerboard, circular and polygonal areas of p-top layer 108.

Figure 4:
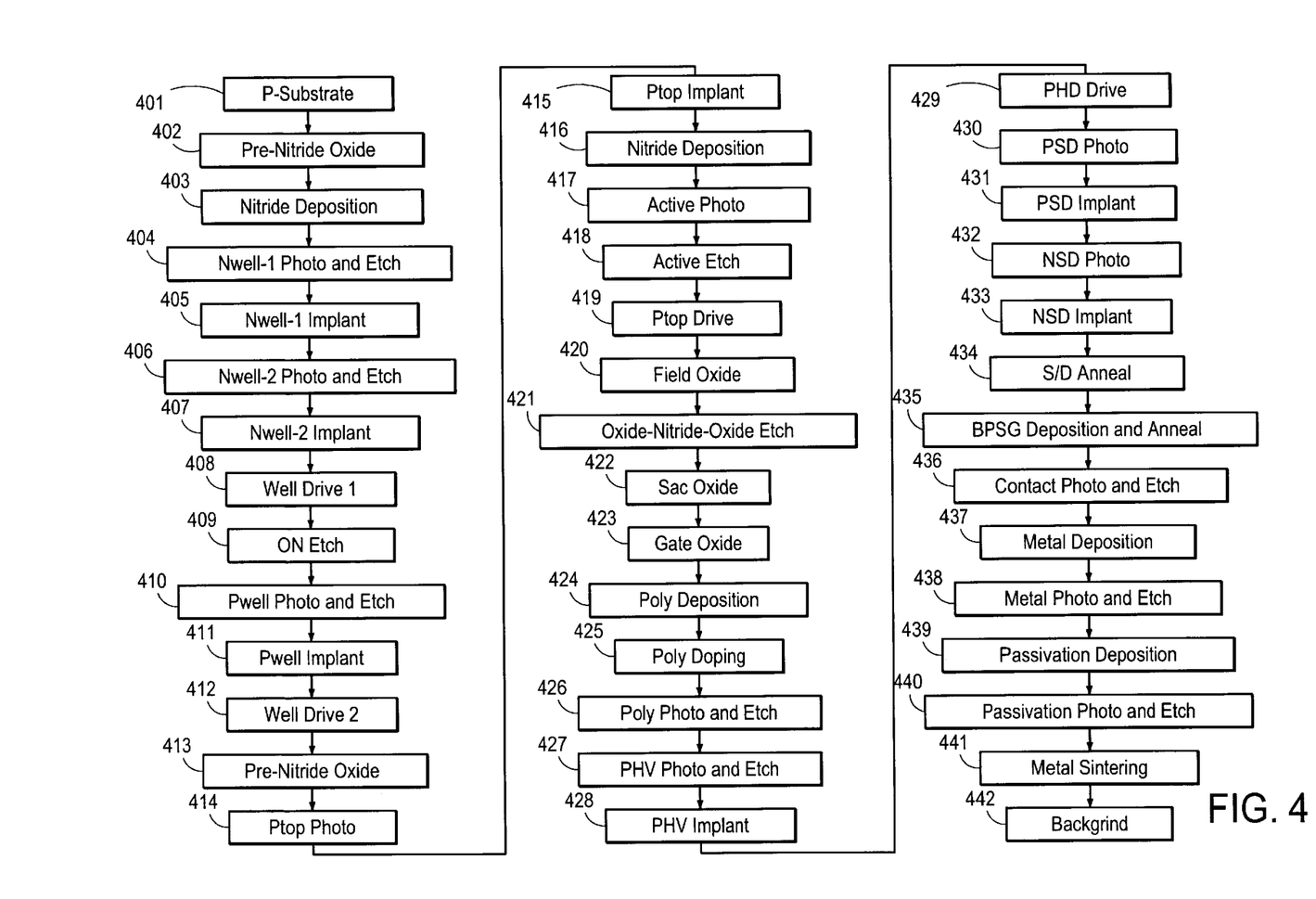
FIG. 4 is a flowchart listing the steps in the manufacture of the semiconductor device.

FIG. 4 is a flow chart outlining the manufacturing of semiconductor device 100. Initially, in step 401, a p-type substrate 101 is provided. Next, a pre-nitride oxide layer 402 is grown on the top surface of the substrate, followed by the deposition of nitride in step 403. In step 404, the nwell regions are formed by the first of two nwell photolithography steps. The nwell-1 photolithography step is done, and then the nitride layer is etched to form the nwell openings. Next, nwell-1 is implanted in step 405, with typically either phosphorus or arsenic as a dopant, through the pre-nitride oxide layer using the nwell-1 opening produced by step 404.

The dose of the nwell-1 implant depends on whether the semiconductor device will have an enhanced nwell region with a first region of high dopant concentration and a second region of low dopant concentration, or if the nwell is to be a single nwell region. If the region is to be a single region, the nwell implant is done once, with a typical dose of $5 \times 10^{12}$ to $6.5 \times 10^{12}$ atoms/cm$^2$. If instead the enhanced nwell region is desired, the nwell-1 implant can be either of high dopant dosage ($4.0 \times 10^{12}$ to $5.0 \times 10^{12}$ atoms/cm$^2$) or low dopant dosage ($1.0 \times 10^{12}$ to $1.5 \times 10^{12}$ atoms/cm$^2$).

In step 406 (which is the optional second nwell implantation), a second nwell masking step is performed to layout the opening for the nwell-2 implant in step 407. The nwell-2 opening is offset from the nwell-1 opening, with the nwell-2 implant performed through the pre-nitride oxide. The implant dose of the second nwell implant is dependent on the dose of the first nwell implant. If the first nwell implant dose is of high dopant concentration, the second nwell implant dose will be of a lower concentration. If the first nwell implant is of a low concentration, the second nwell implant will be of high concentration. First nwell region and second nwell region are offset from one another. A high temperature diffusion process in step 408 is performed to diffuse the nwell 113 implants into the substrate.

Figure 5:
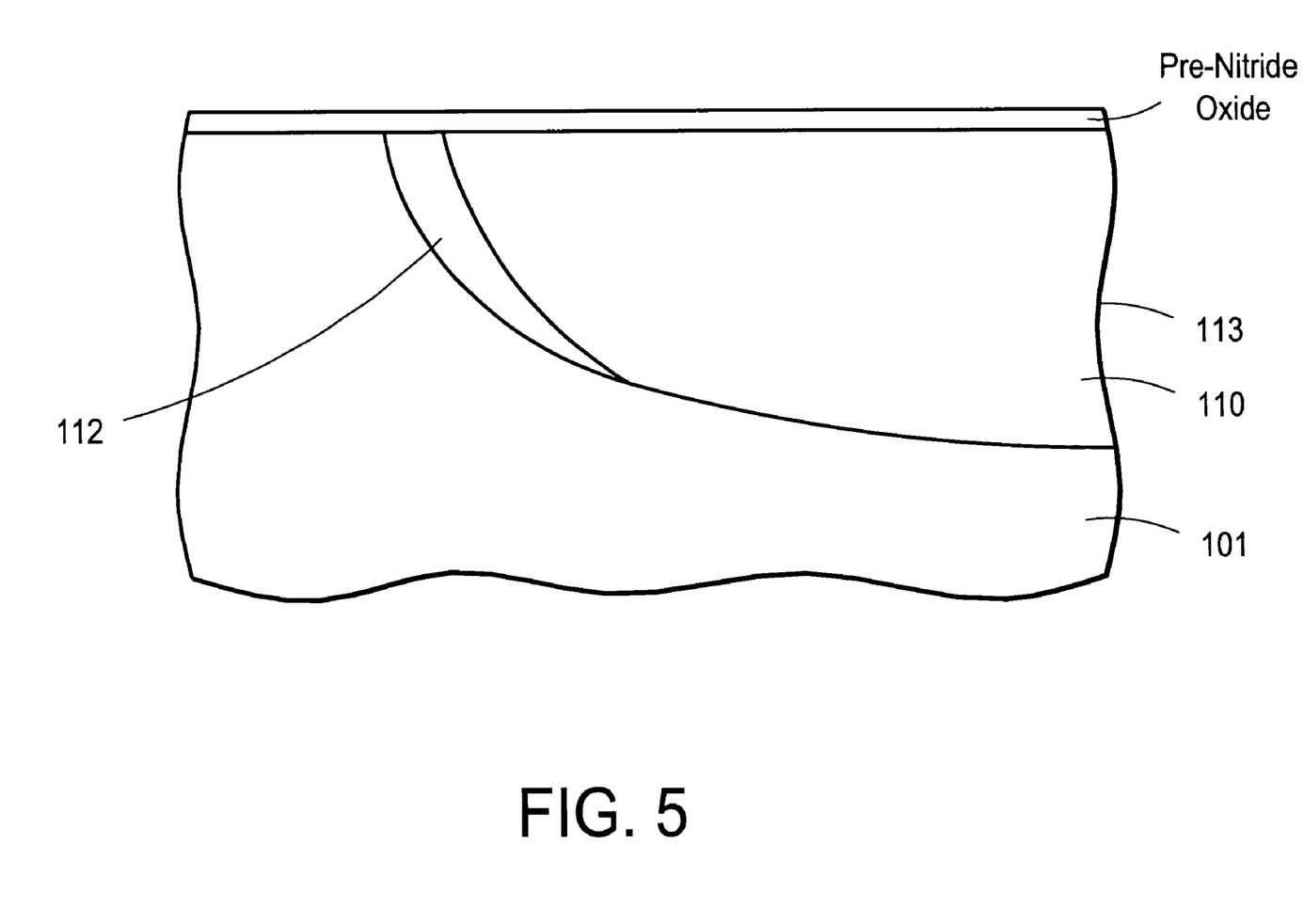
FIGS. 5–7 are cross-sectional views of the semiconductor device at various stages of manufacturing.

Oxide and nitride are removed from the semiconductor device in step 409, leaving behind the pre-nitride oxide beneath the nitride. FIG. 5 illustrates the semiconductor device after step 409.

In step 410, the pwell regions are defined in a photomask step, and then the pwell implant is done in the subsequent step 411 through the pre-nitride oxide. A second high temperature diffusion step 412 drives the previous nwell region deeper and diffuses the pwell. Next, a pre-nitride oxide layer is formed in step 413.

In step 414, the p-top masking step is performed, followed by the p-top implant in step 415. The p-top layer 108 is a p-region applied within the nwell region 113 in order to provide for double RESURF in the nwell region. Next, a layer of nitride is deposited onto the pre-nitride oxide in step 416. Active area photolithography is done in step 417, and then the etching of nitride is performed in step 418.

Figure 6:
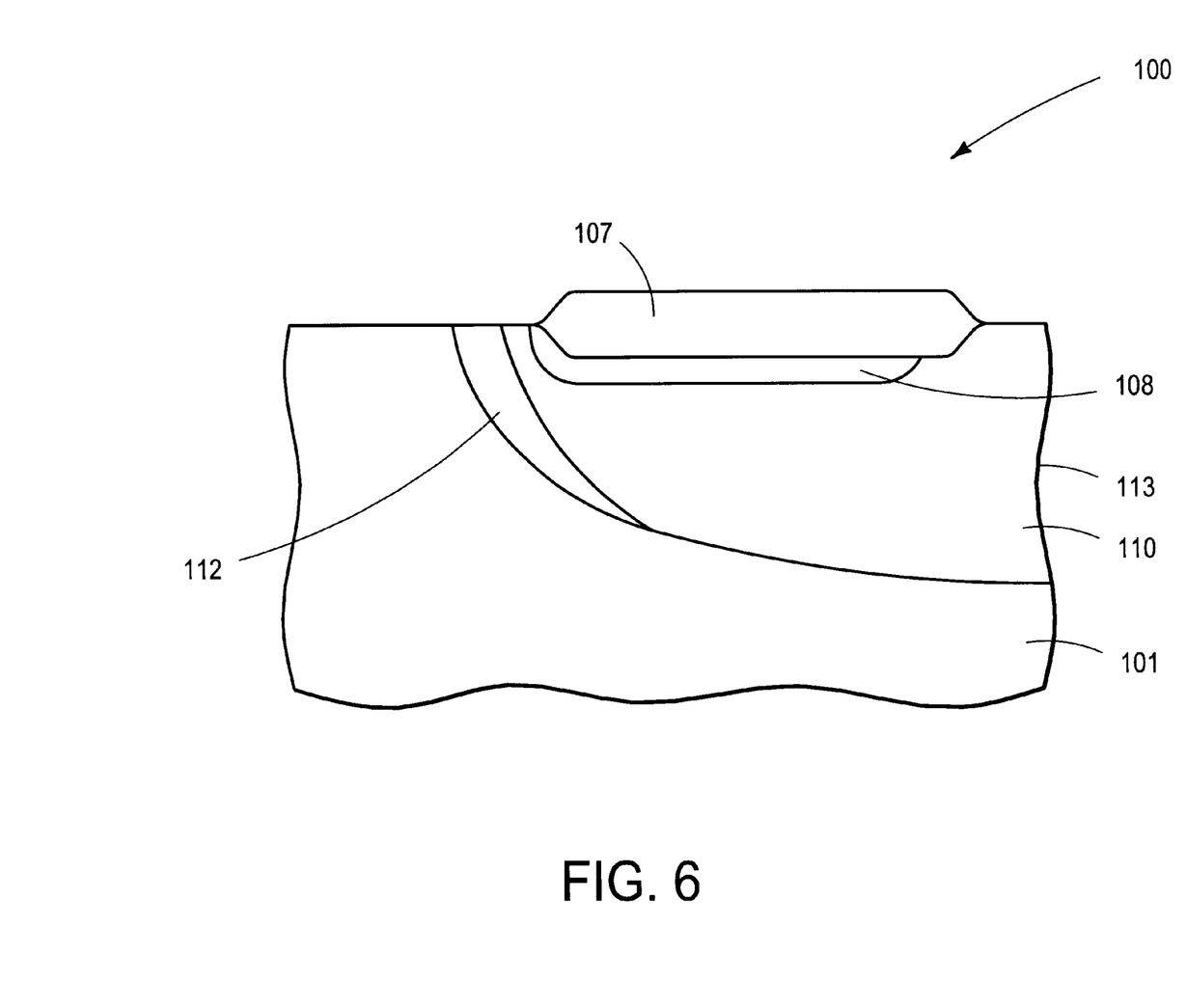

Prior to the growth of field oxide, in step 419, the p-top driven into the nwell by annealing the semiconductor device in an inert atmosphere to insure that the p-top is not entirely consumed during the growth of field oxide. The result is a more predictable and controllable p-top region, and allows for a greater charge to be supported in the nwell region. After the p-top drive, field oxide is grown in step 420. The surface of the substrate is exposed to a high temperature in a steam atmosphere. Next, an oxide-nitride-oxide etch step is done in step 421 to remove the nitride layer and the pre-nitride oxide. FIG. 6 illustrates the semiconductor device after step 421. A layer of sacrificial oxide is grown and etched off in step 422, prior to the growth of the gate oxide 103 in step 423.

Next, in steps 424–426, polysilicon, or other conductive material, is deposited, doped, patterned and etched to form both gate region 105 and drain flap 109 over field oxide region 107 adjacent to the extended drain region.

In steps 427–429 a high voltage p-region 114(PHV) is laid out, implanted and then diffused. The PHV region 114 reduces punch-through to the source and is self-aligned to polysilicon gate 105. In the present invention, PHV region 114 is laterally disposed from nwell region 113. The PHV implant is typically done using boron as a dopant.

Figure 7:
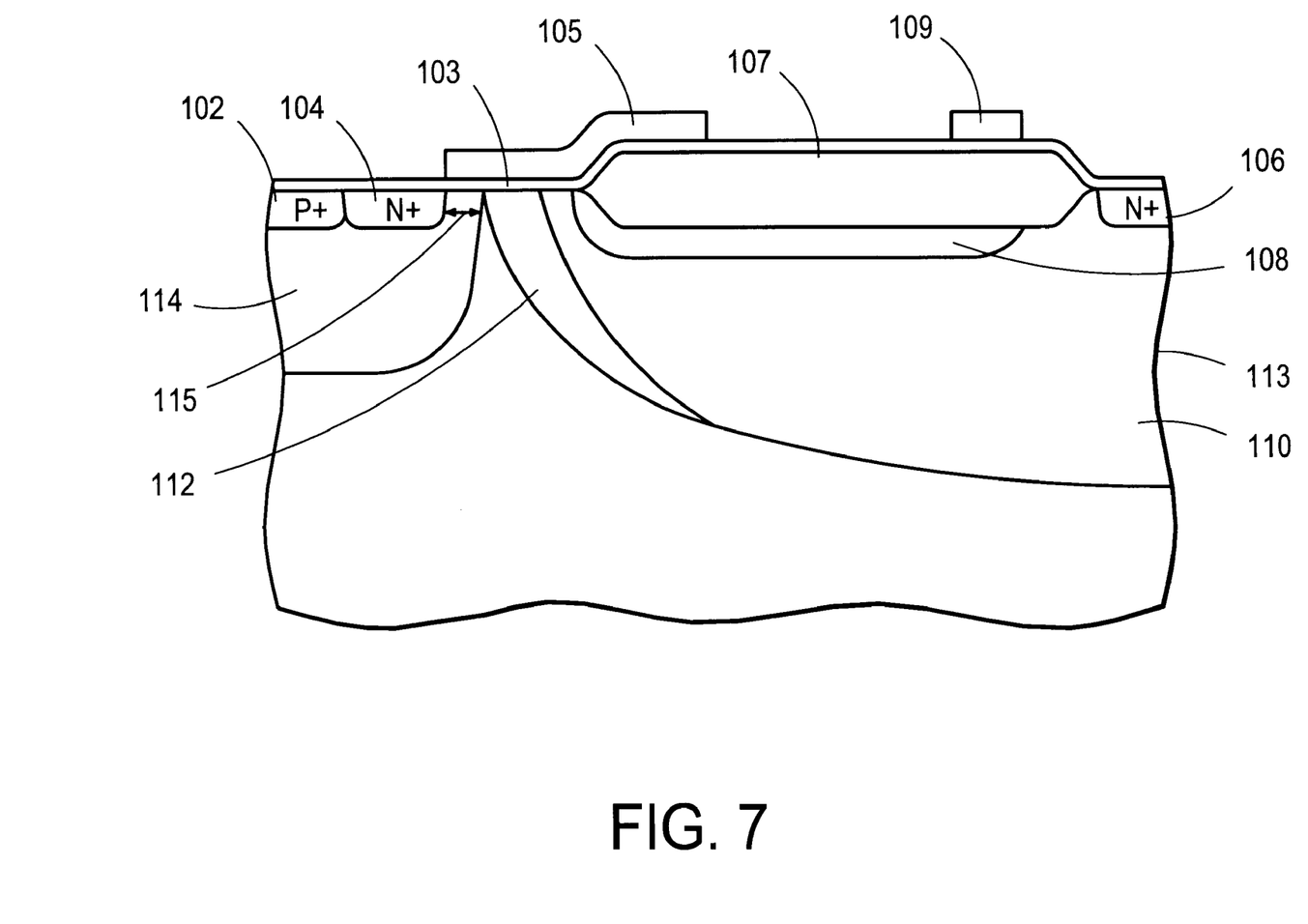

In steps 430–434, the source and drain regions are created. First, a photolithography step for a P+ region (PSD) 102 is done to provide openings where the P+ region will later be implanted. In this embodiment, the PSD is formed in PHV region 114. Next, a N+ region (NSD) photomask step defines source 104 and drain 106 regions of the semiconductor device. Later, in step 433, the NSD implant is done. After the implants are completed, an annealing process occurs that diffuses the PSD 102, source NSD region 104, and drain NSD region 106. FIG. 7 illustrates the semiconductor device after step 434 of the process.

Steps 435–442 are performed to provide for the ILD, metal contact layers, passivation, metal sintering and backgrind. These steps are conventional and well known.

Thus, it is apparent that there has been provided an improved semiconductor device. It should be understood that various changes, substitutions, and alterations are readily ascertainable and can be made herein without departing from the spirit and scope of the present invention as defined by the following claims.

What is claimed is:

1. A semiconductor device, comprising:
    a semiconductor substrate of a first conductivity type;
    a well region of a second conductivity type disposed in the semiconductor substrate; wherein the well region includes
        a first area of first dopant concentration, and
        a second area of second dopant concentration different than the first dopant concentration, the second area laterally offset from the first area,
    a layer of the first conductivity type formed within the first region driven into the well region by annealing the semiconductor device; and
    a dielectric layer disposed over the first region.

2. The semiconductor device of claim 1, further including:
    a polysilicon gate disposed over the semiconductor substrate;
    a diffused region of the first conductivity type disposed in the semiconductor substrate; and
    a source diffusion region disposed in the diffused region of the first conductivity type.

3. The semiconductor device of claim 2, further including a drain diffusion region at a surface of the well region.

4. The semiconductor device of claim 1, further including additional layers of the first conductivity type disposed in the first region.

* * * * *

UNITED STATES PATENT AND TRADEMARK OFFICE
CERTIFICATE OF CORRECTION

PATENT NO. : 6,492,679 B1 Page 1 of 1
APPLICATION NO. : 09/920655
DATED : December 10, 2002
INVENTOR(S) : Mohamed Imam et al.

It is certified that error appears in the above-identified patent and that said Letters Patent is hereby corrected as shown below:

Col. 6, in claim 1, lines 11, 12 and 13, "first region" should read --first area--.

Col. 6, in claim 4, line 3, "first region" should read --first area--.

Signed and Sealed this

Twenty-sixth Day of June, 2007

JON W. DUDAS
*Director of the United States Patent and Trademark Office*